United States Patent [19]

Lin

[11] Patent Number: 5,550,079
[45] Date of Patent: Aug. 27, 1996

[54] METHOD FOR FABRICATING SILICIDE SHUNT OF DUAL-GATE CMOS DEVICE

[75] Inventor: Jengping Lin, Taoyuan Hsien, Taiwan

[73] Assignee: Top Team/Microelectronics Corp., Taipei, Taiwan

[21] Appl. No.: 490,832

[22] Filed: Jun. 15, 1995

[51] Int. Cl.$^6$ ............... H01L 21/265; H01L 21/283
[52] U.S. Cl. ............... 437/56; 437/24; 437/193; 437/200; 437/956
[58] Field of Search ............... 437/200, 193, 437/56, 57, 956, 40 GS, 41 GS, 41 SM, 24; 257/377, 751, 755

[56] References Cited

U.S. PATENT DOCUMENTS

| | | | |
|---|---|---|---|
| 4,703,552 | 11/1987 | Baldi et al. | 437/45 |
| 5,103,272 | 4/1992 | Nishiyama . | |
| 5,190,893 | 3/1993 | Jones, Jr. et al. | 437/192 |
| 5,355,010 | 10/1994 | Fujii et al. | 257/377 |
| 5,369,304 | 11/1994 | Lesk et al. | 257/782 |
| 5,389,575 | 2/1995 | Chin et al. | 437/190 |
| 5,468,669 | 11/1995 | Lee et al. | 437/51 |
| 5,508,212 | 4/1996 | Wang et al. | 437/24 |

FOREIGN PATENT DOCUMENTS 0337481  10/1989  European Pat. Off. .

OTHER PUBLICATIONS

"Three Dual Polysilicon Gate CMOS . . .", IBM Technical Disclosure Bulletin, vol. 27, No. 11. Apr. 1985, pp. 6652–6655.

*Primary Examiner*—T. N. Quach
*Attorney, Agent, or Firm*—Fish & Richardson P.C.

[57] ABSTRACT

A method for fabricating a silicide shunt for use in dual-gate CMOS devices makes use of a nitrogen-containing silicide layer overlying the juncture between the P-type polysilicon layer and the N-type polysilicon layer. The nitrogen-containing silicide layer is formed by implanting nitrogen-containing ions, such as $^{28}N_2^+$, into a partial or overall silicide shunt which was originally deposited over the P-type polysilicon layer and N-type polysilicon layer. Therefore, the nitrogen-containing silicide layer can serve as a diffusion barrier layer retarding the lateral dopant diffusion of these polysilicon layers via the silicide shunt.

25 Claims, 4 Drawing Sheets

5,550,079

METHOD FOR FABRICATING SILICIDE SHUNT OF DUAL-GATE CMOS DEVICE

BACKGROUND OF THE INVENTION

1. Field of the Invention

The present invention generally relates to a fabrication technique for Complementary Metal-Oxide-Semiconductor (CMOS) devices. Particularly, the present invention relates to a method for fabricating silicide shunt for use in dual-gate CMOS device having a barrier layer effectively retarding lateral dopant diffusion.

2. Technical Background

In the structural configuration of a dual-gate CMOS device, a PMOS and a NMOS employing P-type impurities-doped polysilicon layer and N-type impurities-doped polysilicon layer as gates thereof, respectively, have been proposed for sub-quarter micro VLSI fabrication. Owing to the utilization of a P-type polysilicon gate, a threshold-voltage adjustment implantation, usually, by boron ion, for P-MOSFET can be left out, which not only makes P-MOSFET less susceptible to the short channel effect, but also easily optimizes the electrical characteristics of both of NMOS and PMOS devices in symmetry.

Under some circumstances, while the gates of the NMOS and PMOS devices should be connected to each other, it means that the P-type polysilicon gate and N-type polysilicon gate should be joined together. However, a good ohmic contact can not be attained if the polysilicon gates with reverse conductivity types, N-type and P-type, directly come into contact with each other, because of a P-N junction built therebetween. Therefore, a silicide layer is usually provided to form over the P-type and N-type polysilicon gates in parallel serving as a silicide shunt for ensuring the ohmic contact between them. Unfortunately, through the silicide shunt, the fast lateral dopant diffusion between P-type and N-type polysilicon gates degrades the doped concentration and jeopardizes the electrical characteristics thereof. Consequently, a diffusion barrier layer formed within the silicide layer is proposed to retard the lateral dopant diffusion described below.

A conventional process for fabricating silicide shunt for use in a dual-gate CMOS device is shown in FIGS. 1A–1C in cross-sectional view, further accompanied by FIG. 2, a top-view drawing for detailed description. The conventional method is suited to a silicon substrate 1, as shown in FIG. 1A, having twin-well regions, such as a P-well region 100 and an N-well region 102. A oxide layer 104 is formed above the junction between the P-well region 100 and the N-well region 102, through the LOCOS (local oxidation of silicon) method, for isolating NMOS and PMOS devices formed in the P- and N-well region respectively. Then, oxidation to the portion not covered by the oxide layer 104 forms a gate oxide layer 10, about 90 Å in thickness, over the P-well region 100 and the N-well region 102. Subsequently, a polysilicon layer 12, and a silicide layer 14, such as titanium or tungsten silicide, are formed to cover the gate oxide layer 10 and the oxide layer 104, wherein the portion of the silicide layer 14 above the P-well and N-well regions 100 and 102 are respectively implanted with N-type impurities, such as phosphorus, and P-type impurities, such as boron or $BF_2^+$ to form N-type silicide layer 141 and P-type silicide layer 142.

Next referring to FIG. 1B, a photoresist layer 106 with designated patterns is formed on the silicide layer 14 by a photolithography procedure. Through the masking of the photoresist layer 106, the silicide layers 141 and 142 as well as the polysilicon layer 12 are all etched and patterned to form an opening 108 to expose a portion of the oxide layer 104.

Then, the photoresist layer 106 is removed in the step depicted in FIG. 1C. Afterwards, a metal nitride layer 16, such as titanium nitride, is deposited onto the silicide layer 14 and the exposed portion of the oxide layer 104 through the opening 108 serving as a diffusion barrier layer. Furthermore, sequential processes for defining gate patterns, forming N-type source/drain regions 18 and P-type source/drain regions by two implantation procedures accomplish the structural configuration shown in FIG. 2, wherein the region 108 is the area of the opening 108 depicted in FIG. 1B.

However, the conventional method, especially in the step of depositing metal nitride layer 16 as the diffusion barrier layer, suffers from inferior step coverage while depositing the metal nitride layer filling into the opening 108 because of high height to width ratio therein. Moreover, in the procedure of defining the gate patterns, i.e., the etching to the metal nitride layer 16, the silicide layer 14, and the polysilicon layer 12 are required, and therefore the photoresist layer alone can not resist without another silicon oxide layer formed below the photoresist layer 106 as a hard mask. This increases the complexity of fabrication.

SUMMARY OF THE INVENTION

Therefore, it is an object of the present invention to provide a method for fabricating silicide shunt of dual-gate CMOS device to form the diffusion barrier layer by implanting with nitrogen-containing impurities into the silicide layer, but without the process for depositing a metal nitride layer resulting in inferior step coverage problem.

It is further an object of the present invention for providing the method for fabricating silicide shunt of dual-gate CMOS device to simplify the process flow.

The above-identified objects of the present invention achieves by providing a method for fabricating a silicide shunt for use in dual-gate CMOS devices, which makes use of a nitrogen-containing silicide layer overlying the juncture between the P-type polysilicon layer and the N-type polysilicon layer. The nitrogen-containing silicide layer is formed by implanting nitrogen-containing ions, such as $^{28}N_2^+$, into a partial or overall silicide shunt which was originally deposited over the P-type polysilicon layer and N-type polysilicon layer. Therefore, the nitrogen-containing silicide layer can serve as a diffusion barrier layer retarding the lateral dopant diffusion of these polysilicon layers via the silicide shunt.

BRIEF DESCRIPTION OF THE DRAWING

Other objects, features and advantages of the present invention will become apparent by way of the following detailed description of the preferred but non-limiting embodiment. The description is made with reference to the accompanied drawings, wherein.

DETAILED DESCRIPTION OF THE PREFERRED EMBODIMENTS

Embodiment 1

Figure 1A:
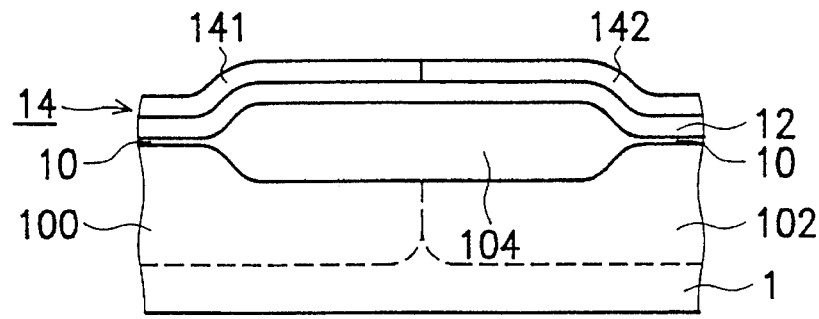
FIGS. 1A–1C are cross-sectional views of a conventional process for forming a silicide shunt for use in a dual-gate CMOS device.
Figure 1B:
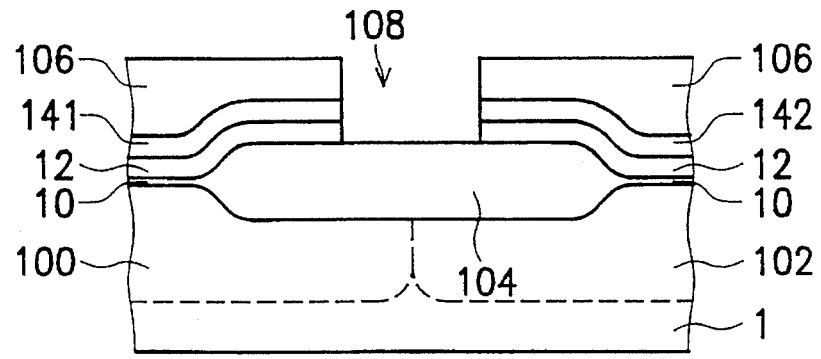
Figure 1C:
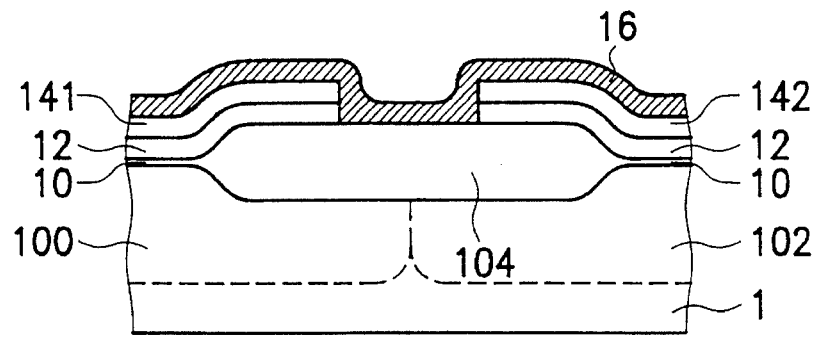
Figure 2:
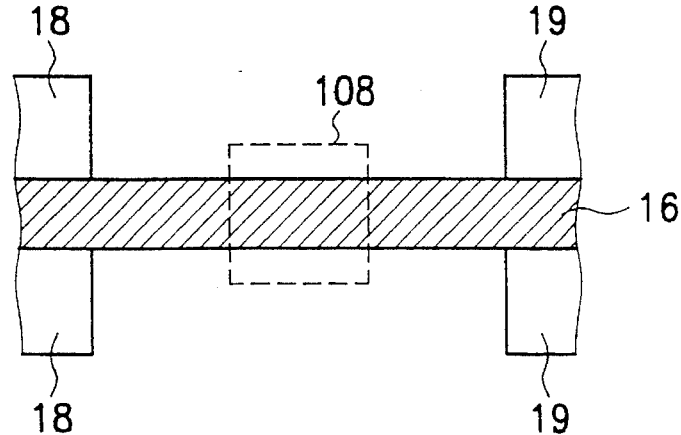
FIG. 2 is a top view of the silicide shunt for use in dual-gate CMOS device by the process depicted in FIGS. 1A–1C.
Figure 3A:
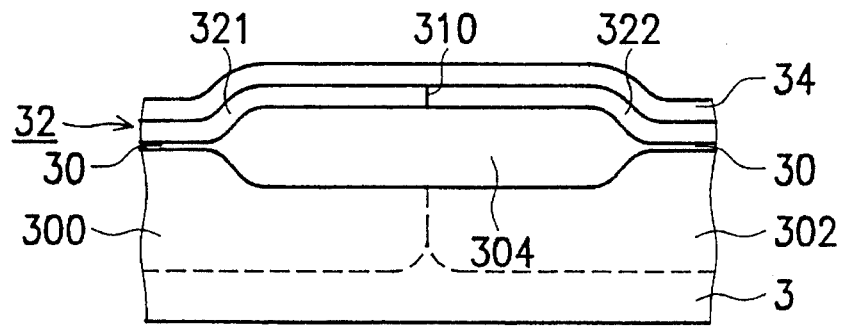
FIGS. 3A–3C are cross-sectional views of a process for forming a silicide shunt for use in a dual-gate CMOS device in accordance with a preferred embodiment of the present invention.
Figure 3B:
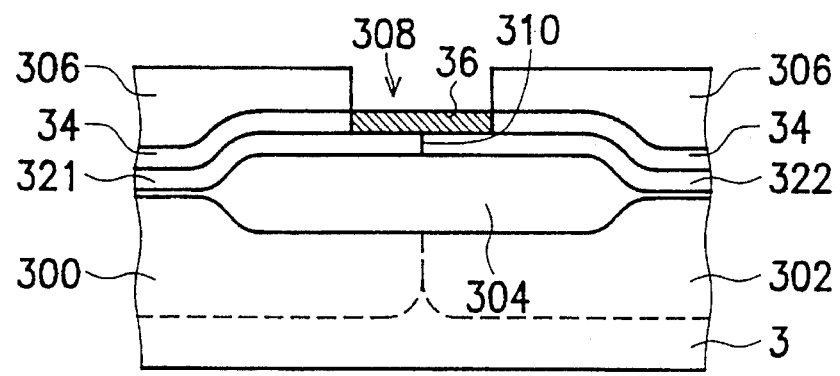
Figure 3C:
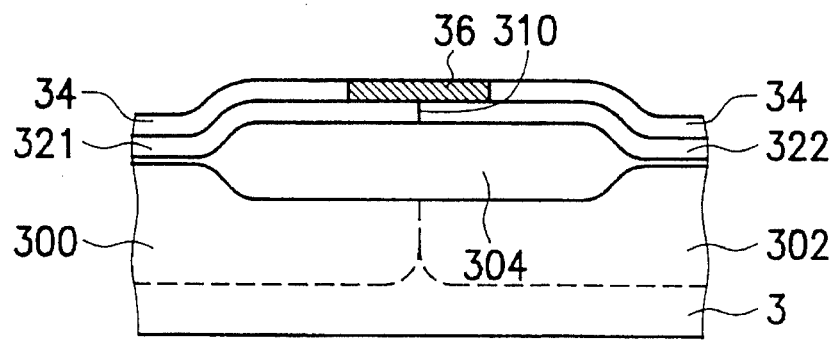

FIGS. 3A–3C illustrates a process for fabricating a silicide shunt used in a dual-gate CMOS device according to a preferred embodiment of the invention. As shown in FIG. 3A, a silicon substrate 3 is provided with twin-well regions, a P-well region 300 and an N-well region 302. A oxide layer 304 is formed above the junction between the P-well region 300 and the N-well region 302, through the LOCOS (local oxidation of silicon) method, for isolating NMOS and PMOS devices fabricated in the P- and N-well regions 300 and 302, respectively, thereafter. Then, oxidation to the portion not covered by the oxide layer 304 forms a gate oxide layer 30, having a thickness of about 90 Å, on the P-well region 300 and N-well region 302. Next, a polysilicon layer 32 with a thickness of about 3000 Å is deposited over the gate oxide layer 30 and the oxide layer 304 by low-pressure chemical vapor deposition (LPCVD). The portions of the polysilicon layer 32 corresponding to the P-type well region 300 and N-well region 302 are respectively implanted with N-type (e.g., phosphorus) and P-type (e.g., Boron or $BF_2$) impurities, to form an N-type polysilicon layer 321 and P-type polysilicon layer 322 further to form a juncture 310 therebetween. This implantation procedure employs an energy of about 50 KeV and a dosage about $5 \times 10^{15} cm^{-2}$, if the N-type impurities are phosphorus. When the P-type impurities are $BF_2$, the implantation energy and dosage are about 55 KeV and $5 \times 10^{15} cm^{-2}$. Afterwards, the processed substrate is exposed to a thermal annealing in $N_2$ ambient for about one hour at a temperature of about 900° C. to activate the implanted impurities.

Next, a silicide layer 34, such as titanium silicide, tungsten silicide or cobalt silicide, etc., is sputtered on the polysilicon layer 32 with a thickness of ranging between about 300–1500 Å. If titanium silicide is selected to constitute the silicide layer 34, firstly, a titanium metal, ranging between 200–800 Å in thickness, is sputtered on the polysilicon layer 32. Then through a two-step annealing procedure, the first one utilizing rapid thermal annealing (RTA) at about 700° C. for about 60 seconds, next removing TiN and titanium remains by a chemical mixture of $NH_4OH:H_2O_2:H_2O=1:1:5$, and then applying another rapid thermal annealing procedure at a temperature of about 800° C. for about 60 seconds, a titanium silicide with C54 phase is formed on the polysilicon layer 32.

Moreover, referring to FIG. 3B, a photoresist layer 306 patterned on opening 308 is formed over the silicide layer 34 by a photolithography procedure. The opening 308 is located over the juncture 310 between the N-type polysilicon layer 321 and P-type polysilicon layer 322. Then, nitrogen-containing ions, such as $^{28}N_2^+$, are implanted into the silicide layer 34 via the opening 308 to form a nitrogen-containing silicide layer 36 as a diffusion barrier layer. This nitrogen-containing ion implantation procedure is performed by ions $^{28}N_2^+$ with an energy within an operable range of between 30–150 KeV at a dosage of between $1E15–5E16 cm^{-2}$.

Figure 4:
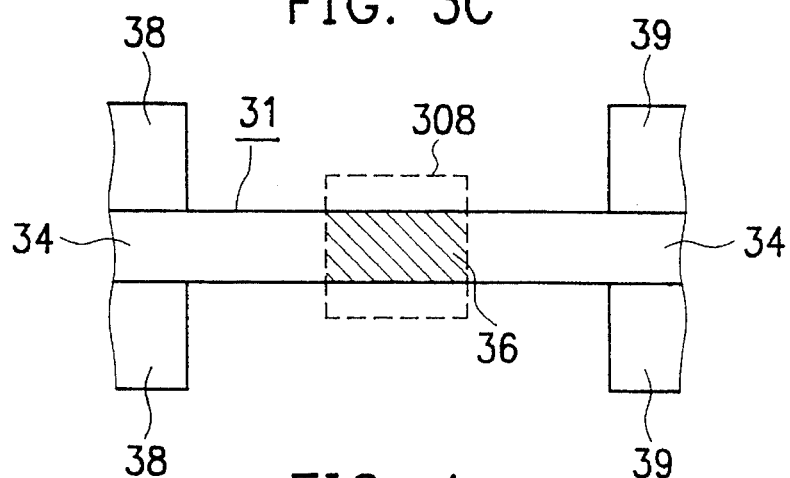
FIG. 4 is a top view of the shunt silicide for use in dual-gate CMOS device by the process depicted in FIGS. 3A–3C.

After the photoresist layer 306 is removed, as shown in FIG. 3C, the silicide layer 34, the nitrogen-containing silicide layer 36 and polysilicon layer 32 is etched and patterned into a gate region 31, and then N-type source/drain regions 38 and P-type source/drain regions 39 are formed through implantation procedures to accomplish the top-view structure shown in FIG. 4, wherein area 308 is the area of the opening 308 depicted in FIG. 3C.

Embodiment 2

Figure 5A:
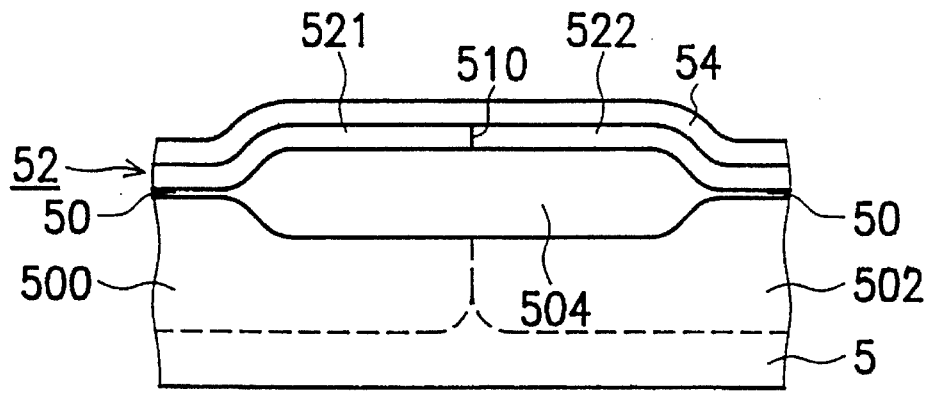
FIGS. 5A–5B are cross-sectional views of a process for forming a silicide shunt for use in a dual-gate CMOS device in accordance with another preferred embodiment of the present invention.
Figure 5B:
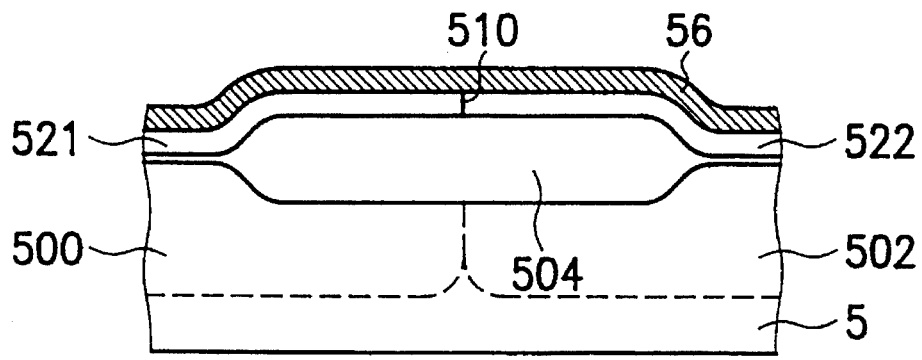

FIGS. 5A–5B illustrates a process for fabricating a silicide shunt used in a dual-gate CMOS device according to another preferred embodiment of the invention. As shown in FIG. 5A, a silicon substrate 5 is provided with twin-well regions, a P-well region 500 and an N-well region 502. A oxide layer 504 is formed above the junction between the P-well region 500 and the N-well region 502, through the LOCOS (local oxidation of silicon) method, for isolating NMOS and PMOS devices fabricated in the P- and N-well regions 500 and 502, respectively, in the following. Then, oxidation to the portion not covered by the oxide layer 504 forms a gate oxide layer 50, having a thickness of about 90 521, on the P-well region 500 and N-well region 502. Next, a polysilicon layer 52, having a thickness of about 3000 Å, is deposited on the gate oxide layer 50 and the oxide layer 504 by low-pressure chemical vapor deposition (LPCVD). The portion of the polysilicon layer 52 corresponding to the P-type well region 500 and N-well region 502 are respectively implanted with N-type (e.g., phosphorus) and P-type (e.g., Boron or $BF_2$) impurities, to form an N-type potysilicon layer 521 and P-type polysilicon layer 522 having a juncture 510 therebetween. This implantation procedure utilizes an energy of about 50 KeV and a dosage about $5 \times 10^{15} cm^{-2}$, if the N-type impurities are phosphorus. When the P-type impurities are $BF_2$, the implantation energy and dosage are about 55 KEV and $5 \times 10^{15} cm^{-2}$. Afterwards, the substrate is exposed to thermal annealing in $N_2$ ambient for about one hour at a temperature of about 900° C. to activate the implanted impurities.

Next, a silicide layer 54, such as titanium silicide, tungsten silicide or cobalt silicide, etc., is sputtered on the polysilicon layer 52 to a thickness of between 300–1500 Å. If titanium silicide is selected to constitute the silicide layer 54, firstly, a titanium metal, ranging between 200–800 Å in thickness, is sputtered on the polysilicon layer 52. Then through a two-step annealing procedure, the first one utilizing rapid thermal annealing at about 700° C. for about 60 seconds, next removing TiN and titanium remains by the chemical mixture of $NH_4OH:H_2O_2:H_2O=1:1:5$, and then applying another rapid thermal annealing procedure at a temperature of about 800° C. for lasting about 60 seconds, a titanium silicide with C54 phase is formed on the polysilicon layer 52.

Figure 6:
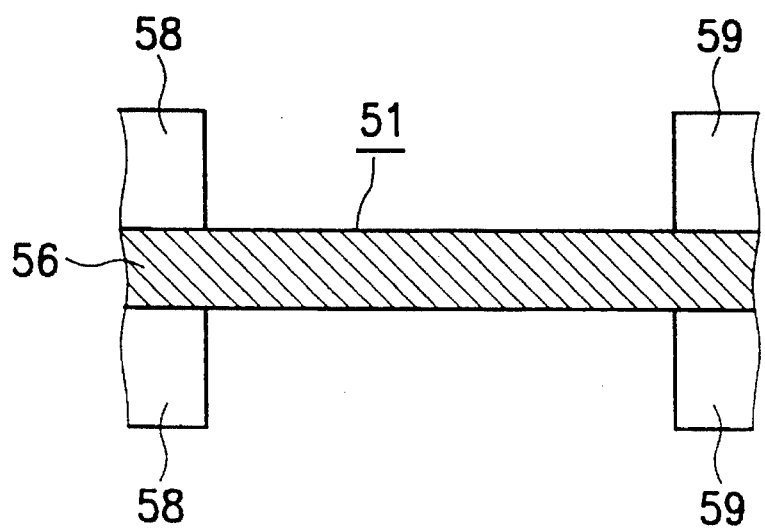
FIG. 6 is a top view of the shunt silicide for use in a dual-gate CMOS device by the process depicted in FIGS. 5A–5B.

Moreover, referring to FIG. 5B, nitrogen-containing ions, such as $^{28}N_2^+$, are implanted into the overall silicide layer 54 for forming a nitrogen-containing silicide layer 56 as a diffusion barrier layer. This nitrogen-containing ion implantation procedure is performed by ions $^{28}N_2^+$ with an energy within an operable range of between 30–150 KeV at a dosage of between $1\times10^{15}$ to $5\times10^{16}$ cm$^{-2}$. Afterwards, the nitrogen-containing silicide layer 56 and the polysilicon layer 52 are etched and patterned into a gate region 51, and then N-type source/drain regions 58 and P-type source/drain regions 59 are formed through implantation procedures to accomplish the top-view structure shown in FIG. 6.

Embodiment 3

Figure 7A:
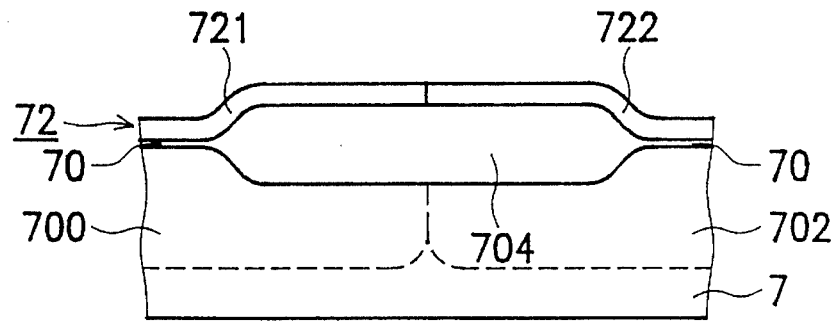
FIGS. 7A–7C are cross-sectional views of a process for forming a silicide shunt for use in a dual-gate CMOS device in accordance with further another preferred embodiment of the present invention.
Figure 7B:
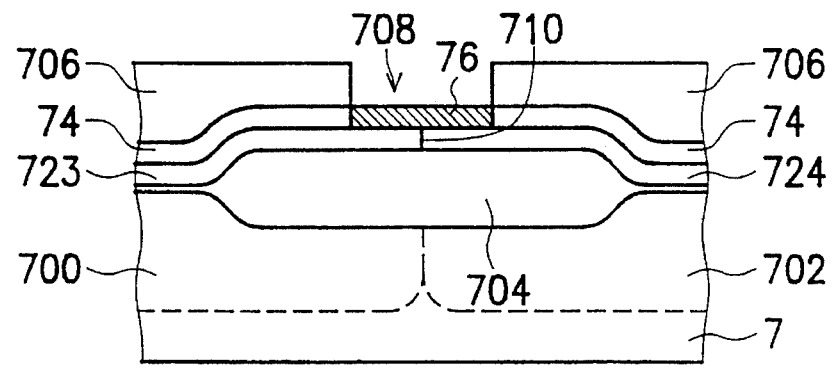
Figure 7C:
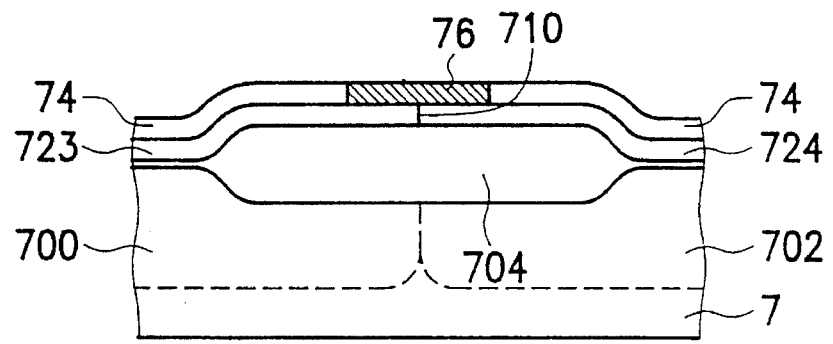

FIGS. 7A–7C illustrate a process for fabricating a silicide shunt used in a dual-gate CMOS device according to yet another preferred embodiment of the invention. As shown in FIG. 7A, a silicon substrate 7 is provided with twin-well regions, a P-well region 700 and an N-well region 702. A oxide layer 704 is formed above the junction between the P-well region 700 and the N-well region 702, through the LOCOS (local oxidation of silicon) method, for isolating NMOS and PMOS devices fabricated in the P- and N-well regions 700 and 702, respectively, thereafter. Then, oxidation to the portion not covered by the oxide layer 704 forms a gate oxide layer 70, having a thickness of about 90 Å, on the P-well region 700 and N-well region 702. Next, a polysilicon layer 72, having a thickness of about 3000 Å, is deposited over the gate oxide layer 70 and the oxide layer 704 by low-pressure chemical vapor deposition (LPCVD). The portion of the polysilicon layer 72 corresponding to the P-type well region 700 and N-well region 702 are respectively doped with N-type (e.g., phosphorus) and P-type (e.g., Boron or BF$_2$) impurities, to form an N-type polysilicon layer 721 and P-type polysilicon layer 722 with an energy of about 50 KeV and a dosage about $5\times10^{15}$ cm$^{-2}$, if the N-type impurities are phosphorus. When the P-type impurities are BF$_2$, the implantation energy and dosage are about 55 KeV and $5\times10^{15}$ cm$^{-2}$. Afterwards, the processed substrate is exposed to a thermal annealing in N$_2$ ambient for about one hour at a temperature of about 900° C. to activate the implanted impurities.

Figure 8:
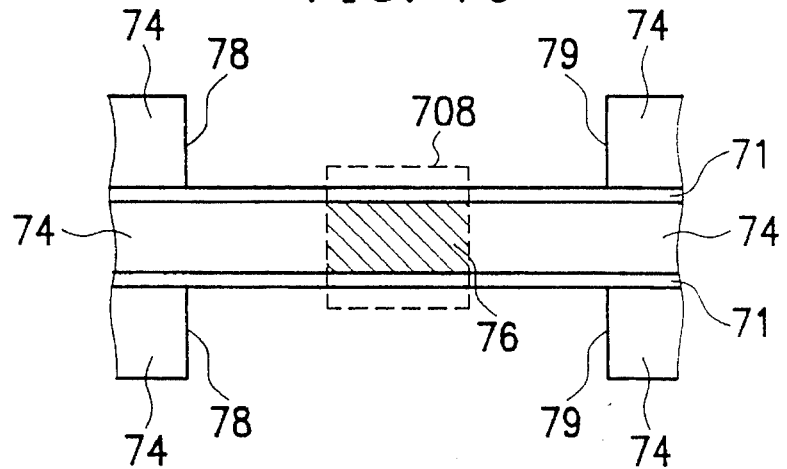
FIG. 8 is a top view of the shunt silicide for use in a dual-gate CMOS device by the process depicted in FIGS. 7A–7C.

Next, N-type polysilicon layer 721 and P-type polysilicon layer 722 are etched and patterned into a N-type gate 723 and a P-type gate 724 through a photolithography procedure as shown in FIG. 7B. Then, N-type source/drain regions 78 and P-type source/drain regions 79 (as shown in FIG. 8) are formed by means of implantation procedures, and a silicide layer 74, such as titanium silicide, tungsten silicide or cobalt silicide, etc., is selectively formed on the gates 723 and 724 as well as the source/drain regions 78 and 79 with a thickness of ranging between about 300–500 Å. If titanium silicide is selected to constitute the silicide layer 74, firstly, spacers 71 (as shown in FIG. 8) are formed on the sidewalls of the gates 723 and 724, and then a titanium metal, ranging between about 200–800 Å in thickness, is sputtered on the overall surface. Then through two-step annealing procedure, the first one utilizing rapid thermal annealing at about 700° C. for about 60 seconds, next removing TiN and titanium remains by the chemical mixture of NH$_4$OH:H$_2$O$_2$:H$_2$O= 1:1:5, and then applying another rapid thermal annealing procedure at a temperature of about 800° C. for about 60 seconds, a titanium silicide with C54 phase is formed on the gates 723 and 724 as well as the source/drain regions 78 and 79 but not over the spacers 71. This is the so-called self-aligned silicide (SALICIDE) technique well known in the art.

Moreover, referring to FIG. 7B, a photoresist layer 706 patterned on opening 708 is formed the surface of the substrate by a photolithography procedure. The opening 708 is located over the juncture 710 between the N-type gate 723 and P-type gate 724. Then, nitrogen-containing ions, such as $^{28}N_2^+$, are implanted into the silicide layer 74 via the opening 708 to form a nitrogen-containing silicide layer 76 as a diffusion barrier layer. This nitrogen-containing ion implantation procedure is performed by ions $^{28}N_2^+$ with an energy within an operable range of about 30–150 KeV at a dosage of between $1\times10^{15}$ to $5\times10^{16}$ cm$^{-2}$.

After the photoresist layer 706 is removed in the step shown in FIG. 7C the top-view structure shown in FIG. 8 is the result, wherein area 708 is the area of the opening 708 depicted in FIG. 7C.

In conclusion, the present invention, the method for fabricating a silicide shunt for use in a dual-gate CMOS device, makes use of nitrogen ions implanted into a silicide shunt to form the nitrogen-containing silicide layer above the juncture between the P-type polysilicon layer and N-type polysilicon layer as the diffusion barrier layer. Therefore, the inferior step-coverage problem of the conventional method that utilizes a metal nitride layer can be avoided.

While this invention has been described in terms of the above specific embodiments, those skilled in the art will recognize that the invention can be practiced with modifications within the spirit and scope of the appended claims, i.e. that changes can be made in form and detail, without departing from the spirit and scope of the invention. Accordingly, all such changes that come within the purview of the invention encompass the subject matter of the claims which follow.

What is claimed is:

1. A method for fabricating a silicide shunt for dual-gate CMOS devices in a semiconducting substrate having a dielectric layer to isolate a first well region and a second well region therebetween, comprising:

(a) forming a first conducting layer covering said first well region and a second conducting layer covering said second well region, a junction formed between the first and second conducting layers and above said dielectric layer;

(b) forming a silicide layer overlying said first conducting layer and said second conducting layer; and (c) forming a nitrogen-containing silicide layer on said junction through an ion implantation procedure.

2. The method as in claim 1, wherein said implantation procedure of the step (c) makes use of $^{28}N_2^+$ ions.

3. The method as in claim 2, wherein the implantation energy is in the range of 30–150 KeV and the implantation dosage is in the range of $1\times10^{15}$ to $5\times10^{16}$ atoms/cm$^2$.

4. The method as in claim 1, wherein said first and second conducting layers are formed by means of a polysilicon layer doped with impurities of a first conductivity type and a second conductivity type, respectively.

5. The method as in claim 4, wherein said first conductivity type is N-type and said second conductivity type is P-type.

6. The method as in claim 5, wherein said first conductivity type is P-type and said second conductivity type is N-type.

7. The method as in claim 1, wherein said silicide layer is titanium silicide.

8. The method as claimed in claim 1 wherein said silicide layer overlying said first conducting layer and said second conducting layer is formed as a continuous layer.

9. A method for fabricating a silicide shunt for dual-gate CMOS devices in a semiconducting substrate having a dielectric layer to isolate a first well region and a second well region therebetween, comprising:

(a) forming a first conducting layer covering said first well region and a second conducting layer covering said second well region, a junction formed between the first and second conducting layers and above said dielectric layer;

(b) forming a silicide layer overlying said first conducting layer and said second conducting layer; and (c) converting said silicide layer into a nitrogen-containing silicide layer through an ion implantation procedure.

10. The method as in claim 9, wherein said implantation procedure makes use of $^{28}N_2^+$ ions.

11. The method as in claim 10, wherein the implantation energy is in the range of 30–150 KeV and the implantation dosage is in the range of $1\times10^{15}$ to $5\times10^{16}$.

12. The method as in claim 9, wherein said first and second conducting layers are formed by means of a polysilicon layer doped with impurities of a first conductivity type and a second conductivity type, respectively.

13. The method as in claim 12, wherein said first conductivity type is N-type and said second conductivity type is P-type.

14. The method as in claim 12, wherein said first conductivity type is P-type and said second conductivity type is N-type.

15. The method as in claim 9, wherein said silicide layer is titanium silicide.

16. The method as claimed in claim 9 wherein said silicide layer overlying said first conducting layer and said second conducting layer is formed as a continuous layer.

17. A method for fabricating a silicide shunt for dual-gate CMOS devices in a semiconducting substrate having a dielectric layer to isolate a first well region and a second well region therebetween, comprising:

(a) forming a first conducting layer covering said first well region and a second conducting layer covering said second well region, a junction formed between the first and second conducting layers and above said dielectric layer;

(b) etching and patterning said first and second conducting layers forming a gate region;

(c) forming a silicide layer overlying said gate region; and (d) forming a nitrogen-containing silicide layer above said junction through an ion implantation procedure.

18. The method as in claim 18, wherein said silicide layer is titanium silicide.

19. The method as in claim 16, wherein the step (c) utilizes two-step rapid thermal annealing (RTA).

20. The method as in claim 17, wherein said implantation procedure makes use of $^{28}N_2^+$ ions.

21. The method as in claim 20, wherein the implantation energy is in the range of 30–150 KeV and the implantation dosage is in the range of $1\times10^{15}$ to $5\times10^{16}$.

22. The method as in claim 17, wherein said first and second conducting layers are formed by means of a polysilicon layer doped with impurities of a first conductivity type and a second conductivity type, respectively.

23. The method as in claim 22, wherein said first conductivity type is N-type and said second conductivity type is P-type.

24. The method as in claim 22, wherein said first conductivity type is P-type and said second conductivity type is N-type.

25. The method as claimed in claim 15 wherein said silicide layer overlying said first conducting layer and said second conducting layer is formed as a continuous layer.

\* \* \* \* \*